(12) United States Patent
Kim et al.

(10) Patent No.: US 9,336,922 B2
(45) Date of Patent: May 10, 2016

(54) METHOD OF FABRICATING THERMOELECTRIC MATERIALS USING CORE-SHELL STRUCTURED NANO-PARTICLES, AND THERMOELECTRIC MATERIALS FABRICATED BY THE SAME

(75) Inventors: Kyung Tae Kim, Busan (KR); Gook Hyun Ha, Busan (KR)

(73) Assignee: Korea Institute of Machinery and Materials, Daejeon (KR)

( * ) Notice: Subject to any disclaimer, the term of this patent is extended or adjusted under 35 U.S.C. 154(b) by 837 days.

(21) Appl. No.: 13/552,372

(22) Filed: Jul. 18, 2012

(65) Prior Publication Data

US 2014/0008589 A1   Jan. 9, 2014

(30) Foreign Application Priority Data

Jul. 19, 2011   (KR) ........................ 10-2011-0071555

(51) Int. Cl.
| | | |
|---|---|---|
| *H01L 35/16* | (2006.01) | |
| *H01B 1/20* | (2006.01) | |
| *B82Y 30/00* | (2011.01) | |
| *H01L 35/12* | (2006.01) | |
| *H01L 35/18* | (2006.01) | |
| *H01L 35/34* | (2006.01) | |

(52) U.S. Cl.
CPC . *H01B 1/20* (2013.01); *B82Y 30/00* (2013.01); *H01L 35/16* (2013.01); *H01L 35/12* (2013.01); *H01L 35/18* (2013.01); *H01L 35/34* (2013.01)

(58) Field of Classification Search
None
See application file for complete search history.

(56) References Cited

U.S. PATENT DOCUMENTS

2002/0044877 A1\*  4/2002  Karino et al. .................. 419/36

FOREIGN PATENT DOCUMENTS

| JP | 2009-141127 | 6/2009 |
|---|---|---|
| JP | 2010-010366 | 1/2010 |
| KR | 1020070117270 | 12/2007 |
| KR | 1020110018102 | 2/2011 |
| KR | 1020110052225 | 5/2011 |
| KR | 20110080279 | \* 7/2011 |
| WO | WO 2010/099146 | 9/2010 |

OTHER PUBLICATIONS

Kim et al. Synthesis of alumuna nanoparticle-embedded-bismuth telluride matrix thermoelectric composite powders. Materials Letters 82 (2012) 141-144.\*
Zhao et al., "Thermoelectric and mechanical properties of nano-SiC-dispersed $Bi_2Te_3$ fabricated mechanical alloying and spark plasma sintering," *Journal of Alloys and Compounds* 455:259-264, 2008.

\* cited by examiner

*Primary Examiner* — Tanisha Diggs
(74) *Attorney, Agent, or Firm* — Klarquist Sparkman, LLP

(57) ABSTRACT

A fabrication method of thermoelectric materials using core-shell structured nano-particles and thermoelectric materials fabricated by the same are provided. The method includes preparing core-shell structured nano-particles having thermoelectric elements coated on the surface thereof (step 1); adding and mixing the prepared core-shell structured nano-particles of step 1, bismuth (Bi) salts, tellurium (Te) salts and a surfactant in a solvent (step 2); adding and dispersing a reducing agent in the mixture of step (step 3); and heating the mixture of step 3 in which reducing agent is added and dispersed (step 4). According to the present invention, thermoelectric materials, nano-phase is homogeneously dispersed inside of thermoelectric grain boundary, can be fabricated and if the fabricated materials are used after sintering and bulking, the thermoelectric materials are maintained in a state that the nano-particles remain in dispersed phase even after sintering.

16 Claims, 12 Drawing Sheets

METHOD OF FABRICATING THERMOELECTRIC MATERIALS USING CORE-SHELL STRUCTURED NANO-PARTICLES, AND THERMOELECTRIC MATERIALS FABRICATED BY THE SAME

CROSS-REFERENCES TO RELATED APPLICATIONS

This patent application claims the benefit of priority from Korean Patent Application No. 10-2011-0071555, filed on Jul. 19, 2011, the contents of which are incorporated herein by reference in its entirety.

BACKGROUND OF THE INVENTION

1. Field of the Invention

The present invention relates to a method of fabricating thermoelectric materials using core-shell structured nano-particles, and thermoelectric materials fabricated by the same.

2. Description of the Related Art

Thermoelectric materials are energy conversion materials that create electric potential when there is a temperature difference between both ends or create temperature difference when there is electric potential. In early 19 century, thermoelectric effect was specified as Seebeck effect, Peltier effect and Thomson effect. Since late 1930's, the thermoelectric materials have been used for a special independent power supply using thermoelectric generator in the field of aerospace and military, mainly in U.S. and Europe. Nowadays, a generator using heat and waste heat of a car or incinerator is developed. Also, the thermoelectric materials are widely used for a refrigerator/heating cabinet, a small sized air-condition system and a small sized cooler related to a computer to control the temperature precisely and a cooler/heat exchanger of hot & cold dispenser, and so on.

The generating and cooling capacity of thermoelectric materials are represented as a figure of merit given by $ZT=(\sigma\alpha^2/\kappa)T$, wherein $\alpha$ is Seebeck coefficient, $\sigma$ is electrical conductivity, $\kappa$ is thermal conductivity, and $T$ is absolute temperature. High energy conversion efficiency of thermoelectric materials indicates high figure of merit (ZT). In order to ensure high ZT, electrical conductivity and Seebeck coefficient need to be improved, while thermal conductivity has to be decreased. That is, the characteristics of thermoelectric elements need to be controlled independently to have high electrical conductivity and low thermal conductivity.

Among the variables to determine a figure of merit (ZT), Seebeck coefficient and electrical conductivity are related to the characteristics of transferring charges, and thermal conductivity depends on transferring of phonon. Considering this, the characteristics of thermoelectric materials need to be controlled by micro-structure control. That is, the scattering of charge is minimized within thermoelectric materials to maintain or improve electrical conductivity and the scattering of phonon is maximized to induce the decrease of thermal conductivity, and thus, the figure of merit can be improved.

Meanwhile, the research introducing dispersed phase to thermoelectric matrix phase has recently been studied to fabricate the thermoelectric materials having higher figure of merit (ZT). That is, since a new interface of dispersed phase/thermoelectric phase is formed by grain boundary and dispersed phase of thermoelectric materials actively induces scattering of phonon by introducing nanometer-sized dispersed phase to thermoelectric matrix materials, thermal conductivity thereof efficiently becomes lower and thus, the figure of merit (ZT) can be improved. Since the phonon wavelength is 1-2 nm and the wavelength of charge is 10-nm, using nano-particles sized below 10 nm causes electrical conductivity to be maintained and thermal conductivity to be decreased efficiently. Also, if the size of dispersed phase (nano-particles) is kept below 10 nm, which does not have an affect on the movement of carrier, the problem involved in lowering conductivity as a result of introducing the dispersed phase can be solved. Accordingly, the research of fabricating inner type thermoelectric materials having nano-dispersed phase in the inner grain of thermoelectric matrix materials and thus improving a figure of merit (ZT) has continuously been studied.

L-D. Zhao et al (Thermoelectric and mechanical properties of nano-SiC-dispersed $Bi_2Te_3$ fabricated by mechanical alloying and spark plasma sintering, Journal of Alloys and Compounds 455 (2008) 259-264) mainly teaches a method of mechanical milling thermoelectric powder, such as $Bi_2Te_3$ and nano-dispersed phase to disperse nano-dispersed phase onto thermoelectric matrix phase. However, the thermoelectric elements fabricated by mechanical milling have some problems including agglomeration of nano-dispersed phase and irregular dispersion of nano-phase (i.e., nano-phase is dispersed only for inter-grains of powder), and thus, there is limitation to improve a figure of merit (ZT).

If nano-phase is dispersed only for inter-grains of powder, when fabricating thermoelectric materials by sintering the powder, scattering effect of phonon is mainly performed in grain boundary, while the nano-dispersed phase concentrated on the grain boundary forms a new interface resulted as an effect of dispersed phase, so that it is difficult to induce scattering of phonon.

Korean Patent No. 10-0795194 (granted on Jan. 9, 2008) teaches "method for fabricating thermoelectric materials by mechanical milling-mixing and thermoelectric materials fabricated thereby" and provides a method of fabricating thermoelectric materials in which thermal/electrical characteristics are controlled by mechanical milling for differencing the size of thermoelectric materials, mixing the milled materials, shaping and sintering the materials, and thermoelectric materials fabricated by the same. Although the granted patent contributes to crystallizing and nano-structure of single elements, the patent cannot solve agglomeration of nano-sized dispersed phase by mechanical mixing and since the dispersed phase exists on the surface of Bi—Te metal powder rather than inside of Bi—Te metal powder, the patent cannot be applied to a method of fabricating the thermoelectric materials using nano-dispersed phase as sought after by the present invention.

In addition, Korean Patent Publication No. 10-2011-0018102 (Feb. 23, 2011) describes thermoelectric matrix along with ceramic nano-particles; and composite thermoelectric materials in which the thermoelectric material-matrix and ceramic nano-particles are combined by bi-polar dispersant.

Further, Korean Patent Publication No. 10-2011-0052225 (May 18, 2011) describes nano-composite thermoelectric materials including thermoelectric material-matrix; and metal nano-particles which have higher electrical conductivity than the above mentioned thermoelectric materials and is dispersed in combination therewith.

As explained above, researches to improve figures of merit (ZT) by dispersing nano-dispersed phase within thermoelectric materials have been studied.

In this regard, while researching a method of improving a figure of merit of thermoelectric materials, the inventors of the present invention prepared core-shell structured nano-particles and developed a method of forming thermoelectric materials on the surface of the prepared core-shell structured nano-particles, and thus, completed the present invention.

SUMMARY OF THE INVENTION

The present invention aims to provide a method of fabricating thermoelectric materials using core-shell structured nano-particles, and thermoelectric materials fabricated by the same.

In order to achieve the object explained above, a method of fabricating thermoelectric materials having dispersed nano-particles is provided, which may include steps of: preparing core-shell structured nano-particles having thermoelectric elements coated on the surface thereof (step 1); adding and mixing the prepared core-shell structured nano-particles of step 1, bismuth (Bi) salts, tellurium (Te) salts and a surfactant in a solvent (step 2); adding and dispersing a reducing agent in the mixture of step 2 (step 3); and heating the mixtures of step 3 in which the reducing agent is added and dispersed (step 4).

With a method of fabricating thermoelectric materials using core-shell structured nano-particles, and thermoelectric materials fabricated by the same according to an embodiment, thermoelectric materials in which nano-phase are homogeneously dispersed inside of thermoelectric grain can be fabricated without difficulty and when the fabricated thermoelectric materials are used after sintering and bulking, the thermoelectric materials are maintained in a state that the nano-particles remain in dispersed phase even after sintering. As a result, since lattice phonon scattering effect by matrix grain boundary of thermoelectric elements and scattering effect by nano-phase dispersion are presented simultaneously, not only thermal conductivity can be reduced drastically but also the electrical characteristics are maintained. Accordingly, the thermoelectric materials with improved figure of merit (ZT) value can be fabricated.

BRIEF DESCRIPTION OF THE DRAWINGS

The above and/or other aspects of what is described herein will be more apparent by describing certain exemplary embodiments with reference to the accompanying drawings, in which.

DETAILED DESCRIPTION OF EXEMPLARY EMBODIMENTS

Figure 1:
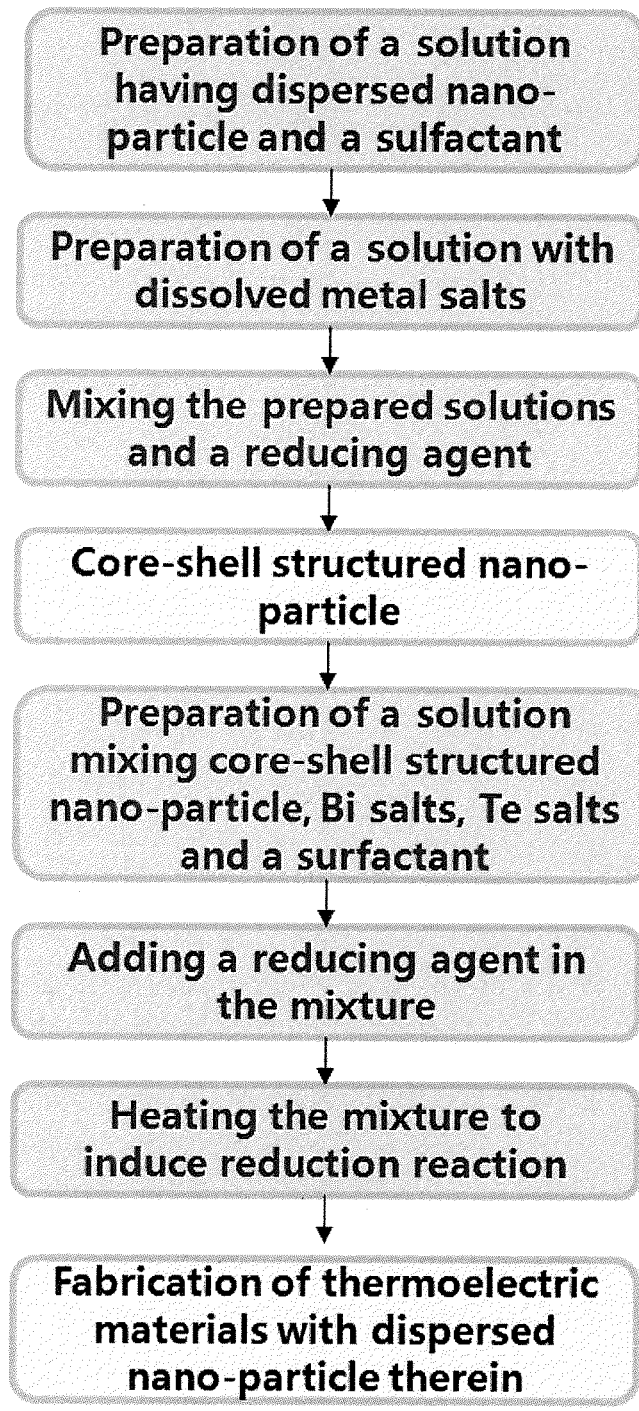
FIG. 1 is a flow chart illustrating each step of a method of fabricating thermoelectric materials according to an embodiment.

Embodiments of the present invention will be explained in greater detail below.

The present invention provides a method of fabricating thermoelectric materials with dispersed nano-particles therein, including steps of: preparing core-shell structured nano-particles having thermoelectric elements coated on surface thereof (step 1); adding and mixing the prepared core-shell structured nano-particles of step 1, bismuth (Bi) salts, tellurium (Te) salts and a surfactant in a solvent (step 2); adding and dispersing a reducing agent in the mixture of step 2 (step 3); and heating the mixtures of step 3 in which the reducing agent is added and dispersed (step 4).

The respective steps according to an embodiment will be explained in greater detail below.

In one embodiment, step 1 is performed to fabricate core-shell structured nano-particles having core-shell structure which thermoelectric elements are coated on the surface thereof. The thermoelectric elements are partially or entirely coated on the surface of the core part to form the core-shell structure.

Generating and cooling capacity of thermoelectric materials are represented as a thermoelectric figure of merit (ZT), and in order to improve the thermoelectric figure of merit, thermal conductivity needs to be decreased while electrical conductivity is maintained. The thermal conductivity of thermoelectric materials can be decreased if the scattering of phonon is increased within the thermoelectric materials, and thus, the figure of merit is improved. The process of dispersing nano-particles within the thermoelectric materials is studied to increase the scattering of the phonon and this forms interface between grain boundary and nano-particles of thermoelectric materials. Accordingly, scattering of phonon can be actively induced.

However, the problem is that it is difficult to have homogeneous dispersion of nano-particles inside of thermoelectric materials. If nano-particles are not homogeneously dispersed therein, it is also difficult to induce the scattering of phonon; therefore, the figure of merit of thermoelectric materials cannot be improved. To solve this problem, core-shell nano-particles having thermoelectric elements coated on the surface thereof is prepared, the thermoelectric materials grow from the surface of the nano-particles, and the thermoelectric materials with homogeneously dispersed nano-particles are fabricated.

The nano-particle includes metal oxide nano-particles, metal nano-particles, or carbonaceous nano-particles, which are fabricated as core-shell structure having thermoelectric elements coated on the surface thereof. The nano-particle may preferably be metal oxide nano-particle, and the metal oxide may include aluminum oxide, magnesium oxide, titanium oxide, indium tin oxide (ITO), indium zinc oxide (IZO), or $BaTiO_3$.

The step 1 of preparing core-shell structured nano-particles may include steps of: adding and dispersing nano-particles along with a surfactant in a solvent (step a); adding and dissolving metal salts of thermoelectric elements to a solvent (step b); mixing the solvent with the dispersed nano-particles of step a), the solvent with the dissolved metal salts of the thermoelectric elements of step b), and a reducing agent (step c); and heating the mixture of step c) (step d).

Step a) is performed to add and disperse nano-particles as a core and a surfactant in a solvent. In one embodiment, metal oxide nano-particles such as aluminum oxide nano-particles may be dispersed homogeneously in a solvent and the solvent may include dioctylether or ethylene glycol.

Step b) is performed to add and dissolve metal salts of thermoelectric elements in a solvent. The metal salts of thermoelectric elements may include bismuth acetate, bismuth chloride or tellurium chloride and the solvent may be dioctylether or ethylene glycol.

Step c) is performed to mix the solvent with the dispersed nano-particle of step a), the solvent with the dissolved metal salts of thermoelectric elements of step b), and a reducing agent. In step c), the solvent with the dispersed nano-particle of step a), the solvent with the dissolved metal salts of thermoelectric elements of step b) and reducing agent are mixed so that core-shell structured nano-particles is prepared as metals (e.g., bismuth (Bi), or tellurium (Te)) precipitated from the metal salts of thermoelectric elements of step b) on the surface of nano-particle of step a). The reducing agent is used to precipitate metal from metal salts of thermoelectric elements of step b) and the reducing agent may be 1,2-hexadecanediol or sodium borohydride ($NaBH_4$) or hydrazine ($N_2H_4$).

Step d) is performed to heat the mixture of step c). The heating of step d) is performed to cause reduction reaction of the thermoelectric elements metal salts in the mixture of step c) and is preferably performed at temperature range between 200 and 300° C. for 10 to 60 min. If the heating is performed out of this range, the speed of reduction reaction is difficult to control and if the heating is performed less than 10 min, the reduction reaction is not fully performed. Also, if the performance of heating exceeds min, inter-agglomeration and overgrowing of core-shell structured nano-particles may be occurred.

Meanwhile, the above-mentioned core part of the core-shell structure preferably has spherical shape having 1 to 10 nm of diameter, but not limited thereto. Shell part of the core-shell structure partially or entirely covers the surface of the core part. For example, the shell part may be formed on the entire surface of the core part with 10 to 30 nm of thickness or thermoelectric elements having 1 to 5 nm size may be partially attached on the surface of the core part, but not limited thereto.

According to the above-mentioned steps, core-shell structured nano-particles having thermoelectric elements coated on the surface thereof can be prepared. Also, in one embodiment, step 2 is performed to add and mix the core-shell structured nano-particles prepared in step 1, bismuth (Bi) salts, tellurium (Te) salts and a surfactant in a solvent. The bismuth salts may include bismuth acetate, or bismuth chloride and the tellurium salts may include tellurium chloride. Meanwhile, antimony salts such as antimony chloride may be additionally added to form P-type thermoelectric elements, and selenium salts such as selenium chloride may be additionally added to form N-type thermoelectric elements, but not limited thereto.

The surfactant may include oleylamine or trioctylphosphine.

In one embodiment, step 3 is performed to add and disperse a reducing agent in the mixture of step 2. The reducing agent is added for reduction reaction of bismuth salts and tellurium salts included in the mixture of step 2 and 1,2-hexadecanediol or sodium borohydride ($NaBH_4$) or hydrazine ($N_2H_4$) may be used as the reducing agent. The dispersion of step 3 may be performed by ultra-sonification to disperse the reducing agent homogeneously, but not limited thereto.

Figure 2:
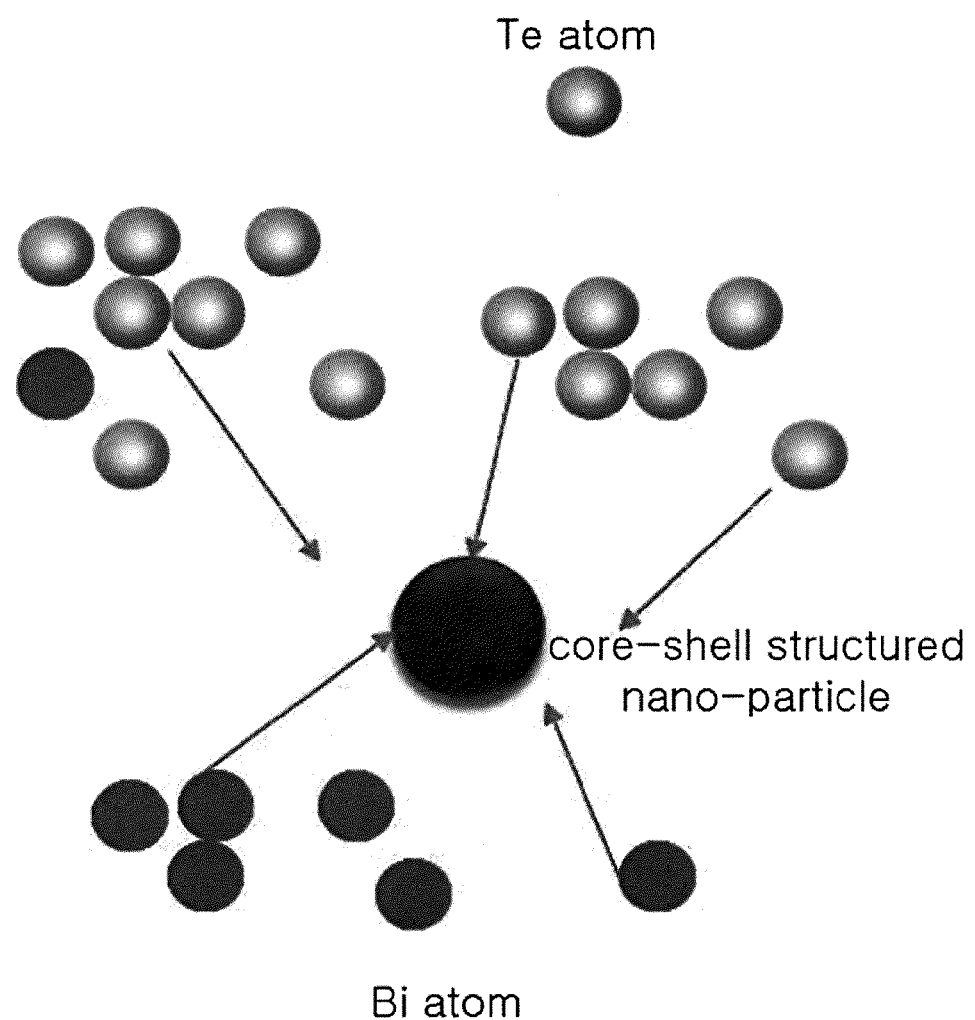
FIG. 2 is a schematic view illustrating the growth of thermoelectric materials from the surface of nano-particles.

In one embodiment, step 4 is performed to heat the mixture of step 3 in which reducing agent is added and dispersed. This heating of step 4 is performed to cause bismuth salts and tellurium salts included in the mixture of step 3 to be reduced to bismuth atoms and tellurium atoms by the reducing agent. The reduced bismuth atoms and tellurium atoms are attached onto the surface of core-shell structured nano-particles and provide a core heterogeneous nucleation sites to grow $Bi_2Te_3$. That is, in performing the heating of step 4, bismuth atoms and tellurium atoms are reduced from bismuth salts and tellurium salts in order to be attached onto the surface of core-shell structured nano-particles. The surface of core-shell structured nano-particles is comprised of a bismuth layer or a tellurium layer on which bismuth atoms and tellurium atoms are easily attached. The attached bismuth atoms and tellurium atoms act as a nucleation sites for the growth of $Bi_2Te_3$. Since $Bi_2Te_3$ is grown from the attached bismuth atoms and tellurium atoms, thermoelectric materials with core-shell structured nano-particles dispersed therein are fabricated. FIG. 2 provides a simple-schematic view illustrating growing of $Bi_2Te_3$ as bismuth atoms and tellurium atoms are attached onto the surface of core-shell structured nano-particles.

Meanwhile, the heating of step 4 is preferably performed at a temperature range between 200 and 300° C. for 30 to 240 min. If the heating is performed out of this range, it is difficult to control the reduction reaction in which bismuth atoms and tellurium atoms are reduced from bismuth salts and tellurium salts. If the heating is performed less than 30 min, the reduction reaction is not fully performed and thus fabrication-yield is decreased. Also, if the heating exceeds 240 min, time and cost are wasted. Accordingly, it is necessary to perform the heating of step 4 at a temperature range between 200 and 300° C. and for 30 to 240 min to control the shape and size of fabricated thermoelectric materials.

Meanwhile, the method according to one embodiment may additionally include step of post-heat treatment after the heat treatment of step 4. By the post-heat treatment, among the core-shell structure nano-particles, bismuth (Bi) or tellurium (Te) of shell part diffuses into thermoelectric materials and subsequently alloys into $Bi_2Te_3$. That is, through the post-heat treatment, most bismuth (Bi) or tellurium (Te) present in initial shell part is substantially alloyed as thermoelectric materials, and a surfactant which may stay within the thermoelectric materials can also be removed.

As the post-heat treatment is additionally included in the method according to an embodiment, Bi layer or Te layer present on the surface of nano-dispersed phase disappears, so that by reducing carrier scattering on the layers as well as core, abrupt reduction of resistivity can be prevented, and the effect of thermal conductivity reduction caused by the core can be clearly confirmed. The post-heat treatment may preferably be performed at 250 to 350° C. in a hydrogen atmosphere for 1 to 5 hr. If the post-heat treatment is performed under 250° C., the energy for diffusing bismuth (Bi) or tellurium (Te) of the shell part is too small to alloy $Bi_2Te_3$ rapidly, and the surfactant attached on the surface of thermoelectric materials is not easily removed. Also, the post-heat treatment has to be performed in a hydrogen atmosphere. Otherwise, large amount of oxygen, which may be formed in thermoelectric materials through surface oxidation process of the synthesizing process, cannot be removed. If the large amount of oxygen is removed, carrier mobility is improved and thus the thermal conductivity of thermoelectric materials can be improved. If temperature of the post-heat treatment exceeds 350° C., a problem involved in non-stoichiometry composition of $Bi_2Te_3$ phase and composition caused by Te volatilization is presented.

With a method of fabricating thermoelectric materials with dispersed nano-particles according to the present invention, by using core-shell structured nano-particles coated with thermoelectric elements including bismuth or tellurium thereon, thermoelectric materials having homogeneously dispersed nano-particles therein are fabricated. Bismuth or tellurium coated on the surface of the core-shell structured nano-particles induces the attachment of bismuth atoms and tellurium atoms thereto and the core-shell structured nano-particles acts as a core for the growth of $Bi_2Te_3$ and thus, $Bi_2Te_3$ reacts and grows. Instead of the conventional fabrication method which mechanically disperses nano-particles onto thermoelectric materials, the fabrication method according to an embodiment of the present invention provides growing of thermoelectric materials from the surface of nano-particle having core-shell structure and solves the drawback of nano-particles agglomeration. Accordingly, nano-particles are homogeneously dispersed inside of the thermoelectric materials. Since the nano-particles form a new interface with grain boundary to induce scattering of phonon, thermal conductivity of thermoelectric materials can be reduced efficiently. Accordingly, a figure of merit (ZT) represented by the following formula can be improved.

$$ZT=(\sigma\alpha^2/\kappa)T \qquad \text{<Formula 1>}$$

where, $\alpha$ is Seebeck coefficient, $\sigma$ is electrical conductivity, $\kappa$ is thermal conductivity, and T is absolute temperature.

According to another embodiment, thermoelectric materials with core-shell structured nano-particles homogeneously dispersed thereon according to the above-mentioned fabrication method, are provided.

In one embodiment, since nano-particles are homogeneously dispersed inside of thermoelectric materials and this induces scattering of phonon, the thermal conductivity of the thermoelectric materials is efficiently decreased. Accordingly, the thermoelectric materials according to the present invention have excellent figures of merit (ZT).

In another embodiment, thermoelectric semi-conductor materials fabricated by bulking the above-mentioned thermoelectric materials, are provided. The thermoelectric materials maintain the dispersion status of nano phase even after sintering. Accordingly, the thermoelectric semi-conductor materials show excellent figure of merit (ZT).

Examples of the present invention will now be described in further detail below. It would be obvious to those skilled in the art that these examples are intended to be more concretely illustrative and the scope of the present invention as set forth in the appended claims is not limited to or by the examples.

EXAMPLE 1

Fabrication Thermoelectric Materials with Dispersed Nano-Particles 1

Step 1: 0.0098 mmol of aluminum oxide ($Al_2O_3$) nano-particles were dispersed in 50 ml of dioctylether (i.e., a solvent) to prepare the solution dispersed nano-particles. In order to disperse aluminum oxide ($Al_2O_3$) nano-particles, a surfactant mixed 0.00245 mM of oleylamine and 0.00245 mM of trioctylphosphine was added and treated with ultrasonic wave for 30 min. Therefore, the solution with the dispersed nano-particles was prepared.

Also, 0.0048 mM of bismuth chloride ($BiCl_3$) was added in 50 ml of dioctylether (i.e., a solvent) and treated with ultrasonic wave for 10 min to prepare the solution in which bismuth chloride ($BiCl_3$) was dissolved.

The solution with dispersed nano-particles and dissolved bismuth chloride was mixed together, the mixture was treated with ultrasonic wave for 10 min, and 0.0048 mM of 1,2-hexadecanediol (i.e., a reducing agent) was added. Then, the final solution was heated until the temperature to be 250° C. and maintained at the temperature for 30 min to prepare nano-particle which bismuth (Bi) was coated on the surface of aluminum oxide ($Al_2O_3$) nano-particles and core-shell structure was presented.

Step 2: 0.01 g of nano-particles having core-shell structure prepared in step 1 was added in 100 ml of dioctylether (i.e., a solvent) and re-dispersed by using ultrasonic wave. Then, 0.153 g of $Bi(CH_3COO)_3$, 0.162 g of $TeCl_4$ and a surfactant were mixed wherein the surfactant was prepared by mixing 0.00245 mM of oleylamine and 0.00245 mM of trioctylphosphine.

Step 3: 0.0048 mM of 1,2-hexadecanediol (i.e., polyol reducing agent) was added in the mixture of step 2 and the mixture was treated with ultrasonic wave.

Step 4: The mixture of step 3 added reducing agent was heated until the temperature to be at 250° C. and maintained at the temperature for 2 hrs to induce chemical reaction of atomizing Bi and Te ions by the added reducing agent, nucleating and growing $Bi_2Te_3$ powder on the surface of nano-particles ($Bi/Al_2O_3$). Accordingly, thermoelectric materials in the form that $Al_2O_3$ nano-particles were homogeneously dispersed inside of $Bi_2Te_3$ powder were fabricated.

EXAMPLE 2

Fabricating Thermoelectric Materials with Dispersed Nano-Particles 2

After performing steps 1 to 4 of Example 1, post-heat treatment is performed at 250° C. for 4 hr in a hydrogen atmosphere. Except the above, thermoelectric materials are fabricated according to the method of Example 1.

COMPARATIVE EXAMPLE 1

In Example 1, steps 2 to 4 are only performed. That is, step 1 prepared core-shell nano-particles was not performed in Comparative Example 1, and thus, thermoelectric materials ($Bi_2Te_3$) in which nano-particles were not dispersed was fabricated.

Analysis (1) X-Ray Diffraction Analysis

Figure 3:
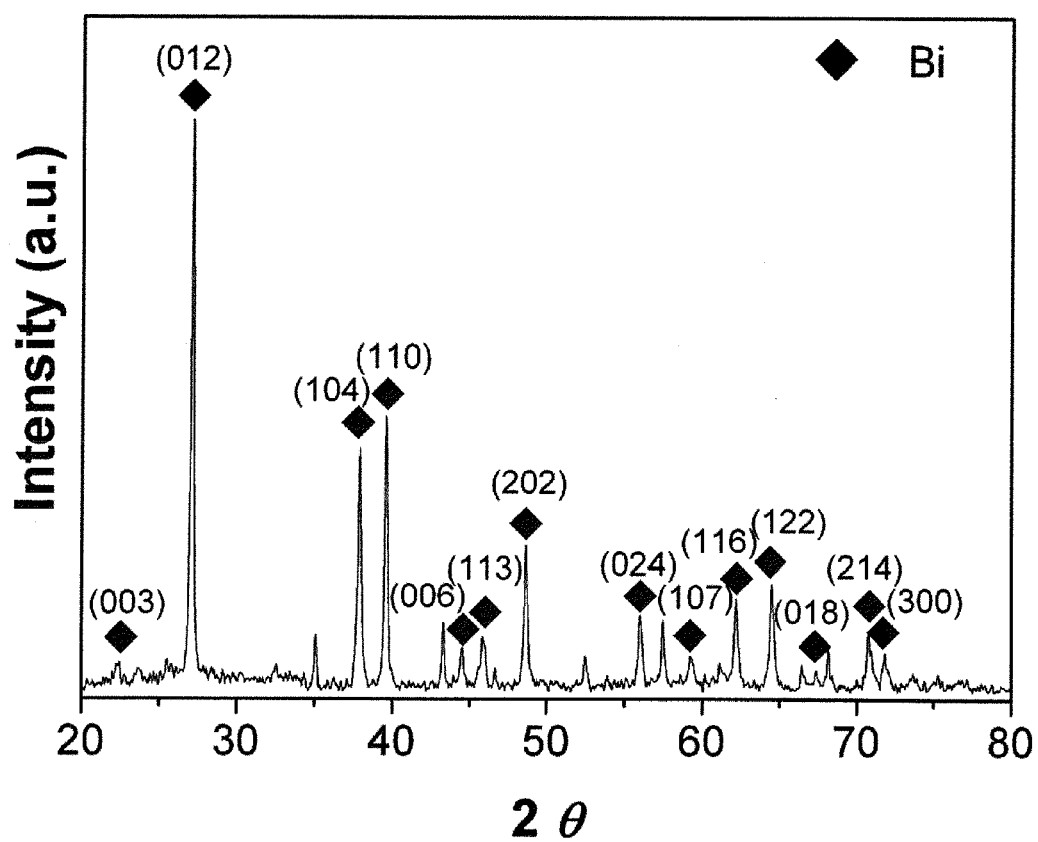
FIG. 3 is a graph providing the result of X-ray diffraction analysis for the core-shell structured nano-particles prepared in step 1 of Example 1.

The core-shell structured nano-particles prepared in step 1 of Example 1 were analyzed by X-ray diffraction and the result is presented in FIG. 3.

Referring to FIG. 3, it is recognized that the core-shell structured nano-particles prepared in step 1 of Example 1 has core-shell structure that bismuth was detected and coated on surface thereof. Accordingly, it is confirmed that nano-particle having core-shell structure can be prepared in step 1 of Example 1 without difficulty.

(2) SEM (Scanning Electron Microscopy) Analysis

Figure 4:
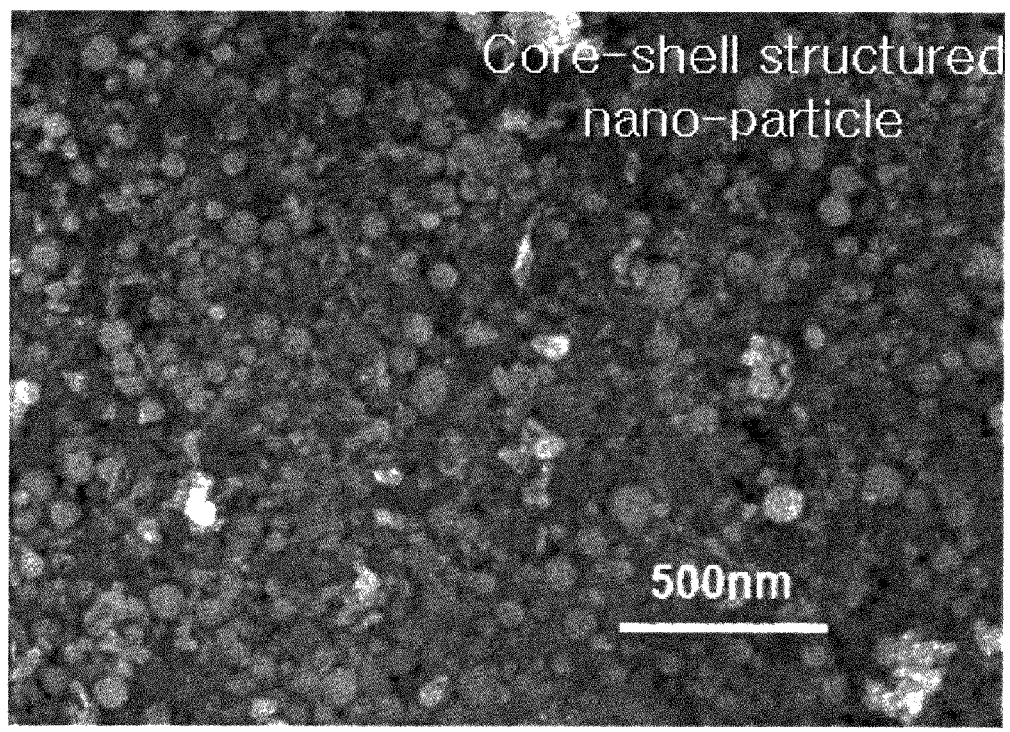
FIG. 4 is a SEM (scanning electron microscopy) image of the core-shell structured nano-particles prepared in step 1 of Example 1.

The nano-powder having core-shell structure prepared in step 1 of Example 1 was observed by a scanning electron microscopy (SEM) and the result is presented in FIG. 4.

Referring to FIG. 4, it is recognized that the core-shell structured nano-particles prepared in step 1 of Example 1 is prepared as nano-particles having more than tens of nm size, and it is confirmed that nano-particle having core-shell structure can be prepared in step 1 of Example 1 without difficulty.

(3) TEM (Transmission Electron Microscopy) Analysis

Figure 5:
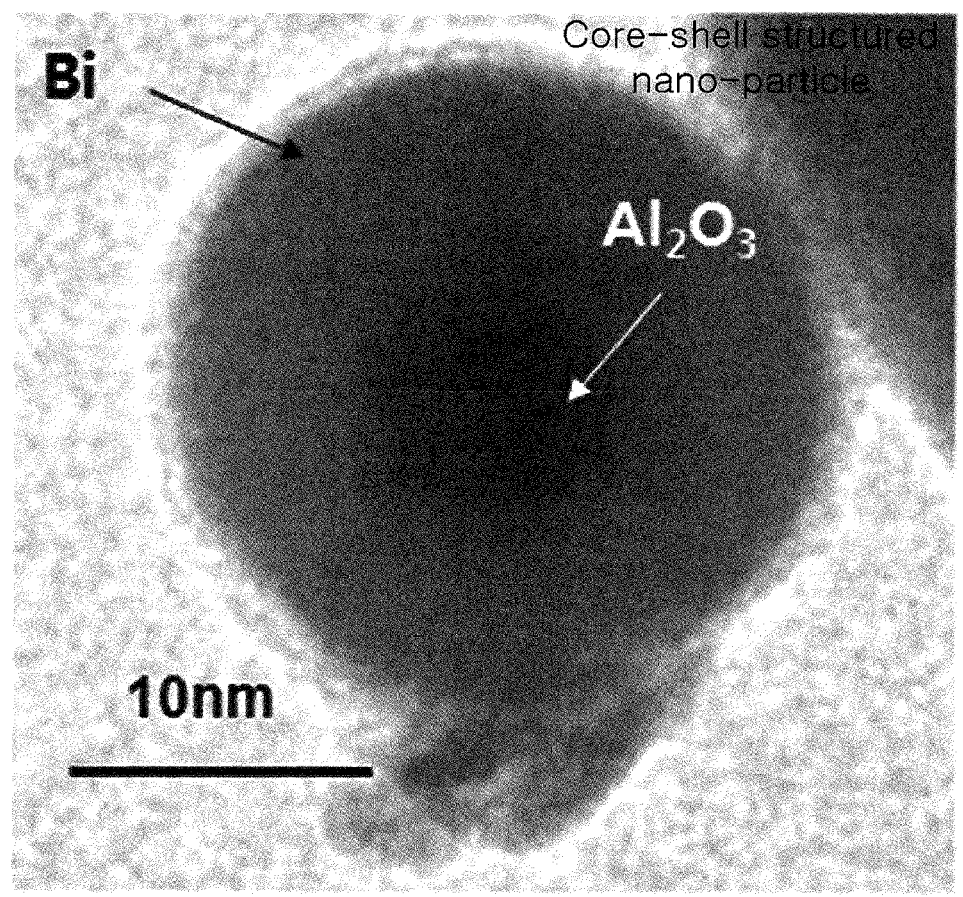
FIG. 5 is a TEM (transmission electron microscopy) image of the core-shell structured nano-particles prepared in step 1 of Example 1.

The nano-particle having core-shell structure prepared in step 1 of Example 1 was observed by a transmission electron microscopy (TEM) and the result is presented in FIG. 5.

Referring to FIG. 5, it is recognized that the core-shell structured nano-particles prepared in step 1 of Example 1 has approximately 15 nm of nano-particles in core-shell structure. That is, aluminum oxide is located on the core part and bismuth is coated in the shell part. Accordingly, it is confirmed that nano-particle having core-shell structure can be prepared in step 1 of Example 1 without difficulty.

EXPERIMENTAL EXAMPLE 1

X-Ray Diffraction Analysis

Figure 6:
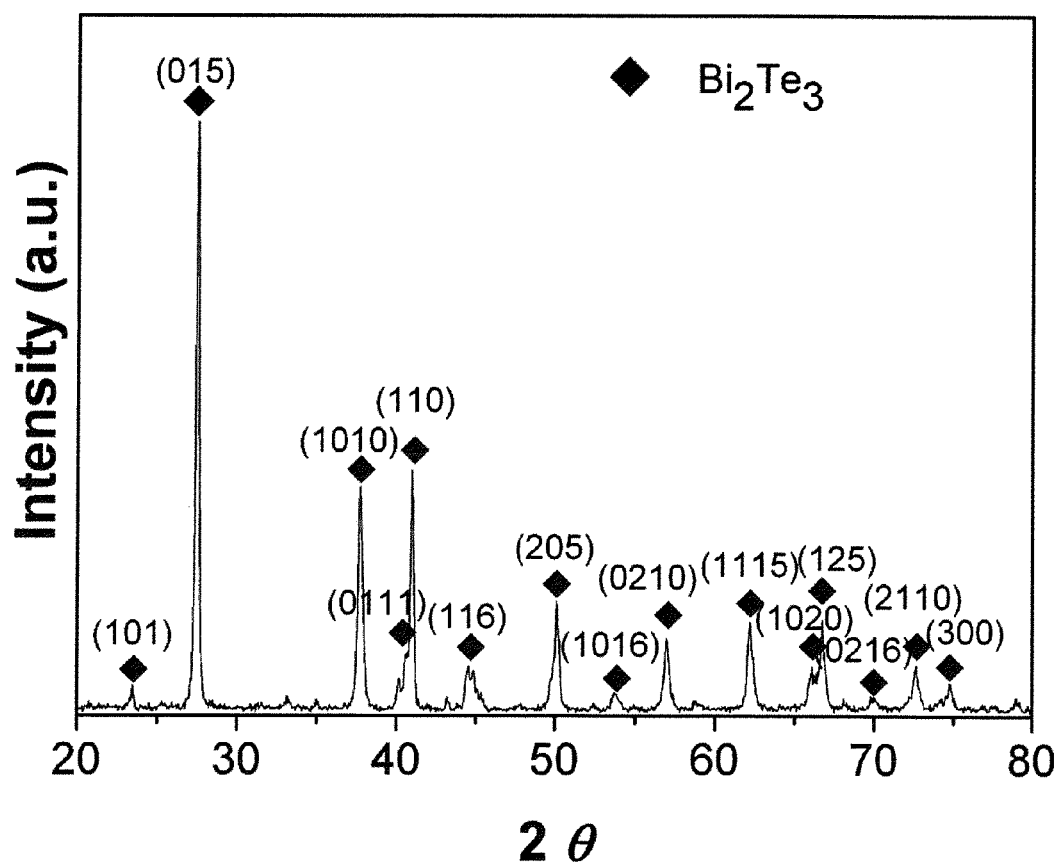
FIG. 6 is a graph providing the result of X-ray diffraction analysis for the thermoelectric materials fabricated in Example 1 according to an embodiment.

The thermoelectric materials dispersed nano-particles and prepared in Example 1 according to the present invention was analyzed by X-ray diffraction and the result is presented in FIG. 6.

Referring to FIG. 6, it is recognized that the thermoelectric materials fabricated in Example 1 are consisted of bismuth telluride ($Bi_2Te_3$). That is, since Bi and Te ions become Bi and Te atoms by reducing agent, the atoms were nucleated as $Bi_2Te_3$ powder on the surface of Aluminum oxide ($Bi/Al_2O_3$) prepared in the form of core-shell structure, and the powder grows to form bismuth telluride ($Bi_2Te_3$). Accordingly, it is confirmed that the thermoelectric materials (i.e., bismuth telluride) which aluminum oxide particles were dispersed therein, are fabricated.

EXPERIMENTAL EXAMPLE 2

SEM (Scanning Electron Microscopy) Analysis

Figure 7:
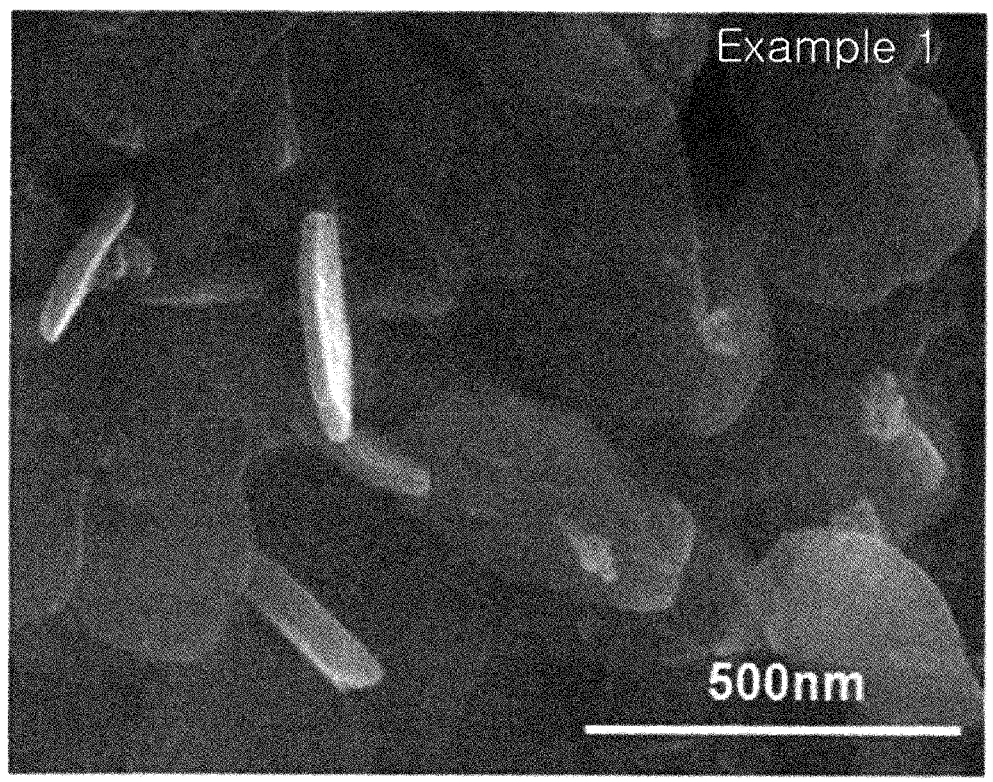
FIG. 7 is a SEM image of the thermoelectric materials fabricated in Example 1 according to an embodiment.

The thermoelectric materials with dispersed nano-particles and fabricated in Example 1 according to the present invention was observed by SEM and the result is presented in FIG. 7.

Referring to FIG. 7, it is recognized that the thermoelectric materials fabricated in Example 1 are in disc shape and consisted of nano-particles having more than hundreds of nm size. The observed nano-particles were bismuth telluride ($Bi_2Te_3$) in which aluminum oxide is dispersed. Accordingly, it is confirmed that thermoelectric materials with dispersed nano-particles therein can be fabricated without difficulty according to an embodiment of the present invention.

EXPERIMENTAL EXAMPLE 3

TEM (Transmission Electron Microscopy) Analysis

Figure 8:
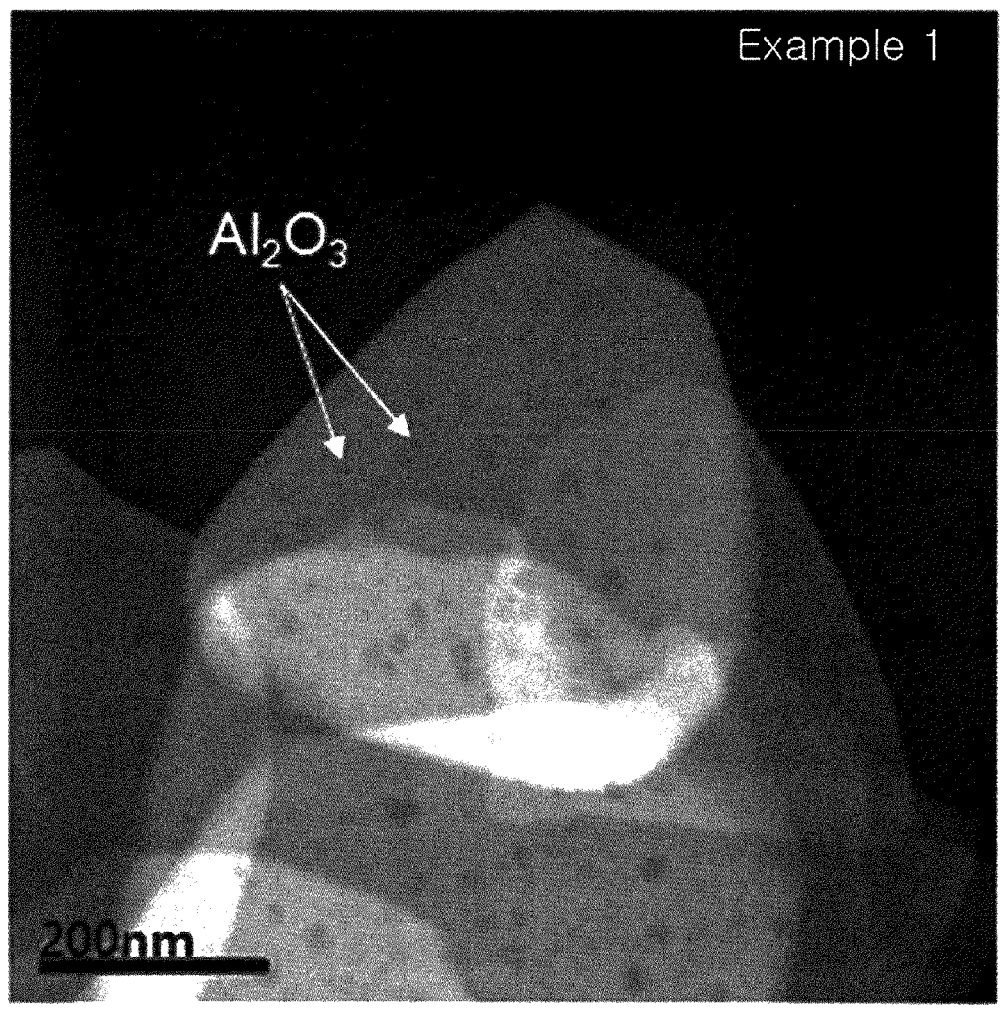
FIGS. 8 and 9 are TEM images of the thermoelectric materials fabricated in Example 1 according to an embodiment.
Figure 9:
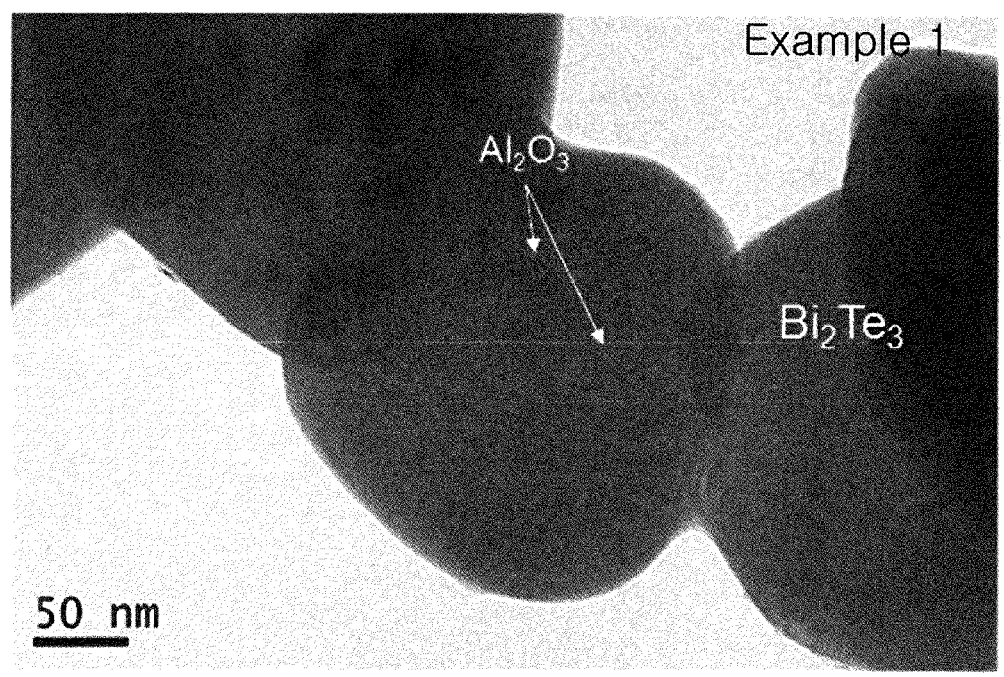

The thermoelectric materials with dispersed nano-particles therein and fabricated in Example 1 according to an embodiment was observed by TEM and the result is presented in FIGS. 8 and 9.

Referring to FIGS. 8 and 9, it is recognized that the thermoelectric materials fabricated in Example 1 are in the form of which aluminum oxide particles are homogeneously dispersed inside of bismuth telluride ($Bi_2Te_3$). Accordingly, it is confirmed that the thermoelectric materials which nano-particles are dispersed inside of the grain boundary can be fabricated without difficulty according to an embodiment of the present invention.

EXPERIMENTAL EXAMPLE 4

Energy Dispersive X-Ray Spectrometry (EDS) Analysis

Figure 10:
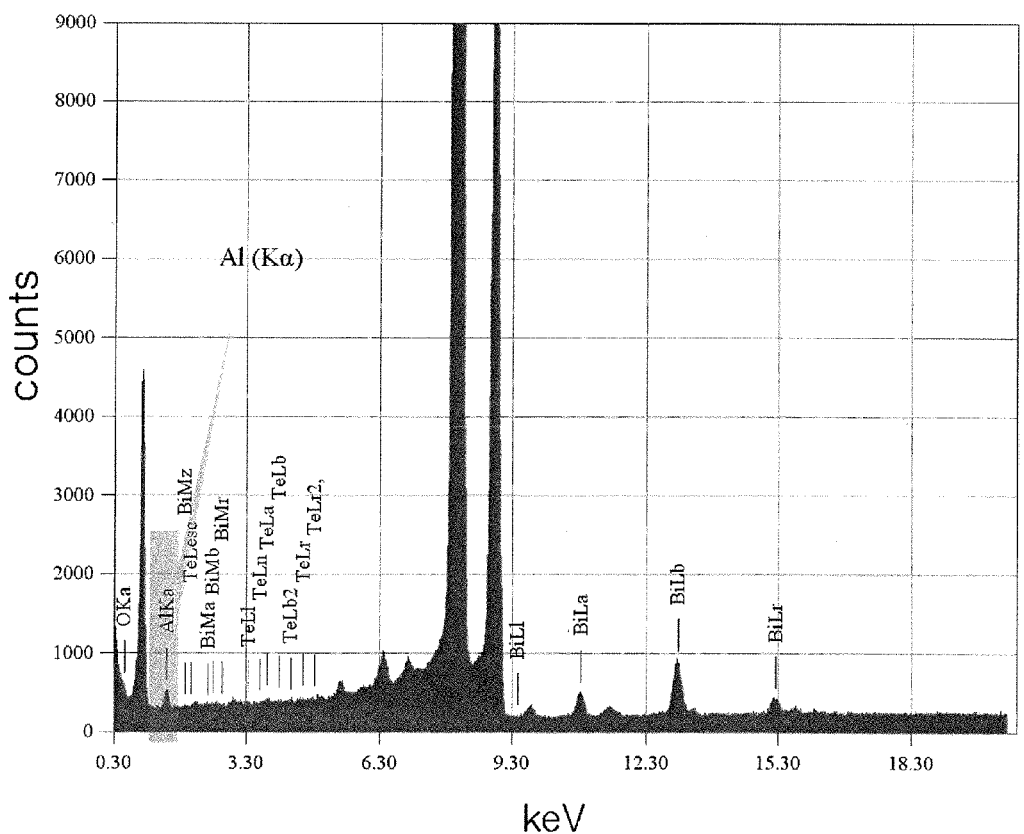
FIG. 10 is a graph providing the result of an energy dispersive X-ray spectrometry analysis for the thermoelectric materials fabricated in Example 1 according to an embodiment.

Among the thermoelectric materials dispersed nano-particles and fabricated in Example 1 according to an embodiment, the particles dispersed inside thereof were analyzed by energy dispersive X-ray spectrometry and the result is presented in FIG. 10.

Referring to FIG. 10, it is recognized that the particles dispersed inside of the thermoelectric materials according to the present invention are aluminum particles and this aluminum is aluminum oxide in core-shell structure prepared in step 1 of Example 1. That is, Bi and Te ions are nucleated and grown as $Bi_2Te_3$ powder on the surface of aluminum oxide ($Bi/Al_2O_3$) prepared to have core-shell structure; therefore, bismuth telluride ($Bi_2Te_3$) is formed. Accordingly, it is known that the thermoelectric materials which aluminum oxide particles are homogeneously dispersed within the bismuth telluride ($Bi_2Te_3$) are fabricated.

EXPERIMENTAL EXAMPLE 5

Thermal Conductivity Analysis

Thermal conductivity of thermoelectric materials fabricated Example 1 and Comparative Example 1 was analyzed. This analysis was performed by measuring Thermal conductivity (W/m·K) after measured thermal diffusivity ($\alpha$, $m^2/s$) by laser flash method and applied the measured thermal diffusivity, specific heat (Cp, (J/(kg·K)) and density ($\rho$, ($kg/m^3$)) to the following formula 2. The result is presented in FIG. 11.

$$\text{Thermal conductivity (W/m·K)} = \alpha \rho Cp \qquad \text{<Formula 2>}$$

Figure 11:
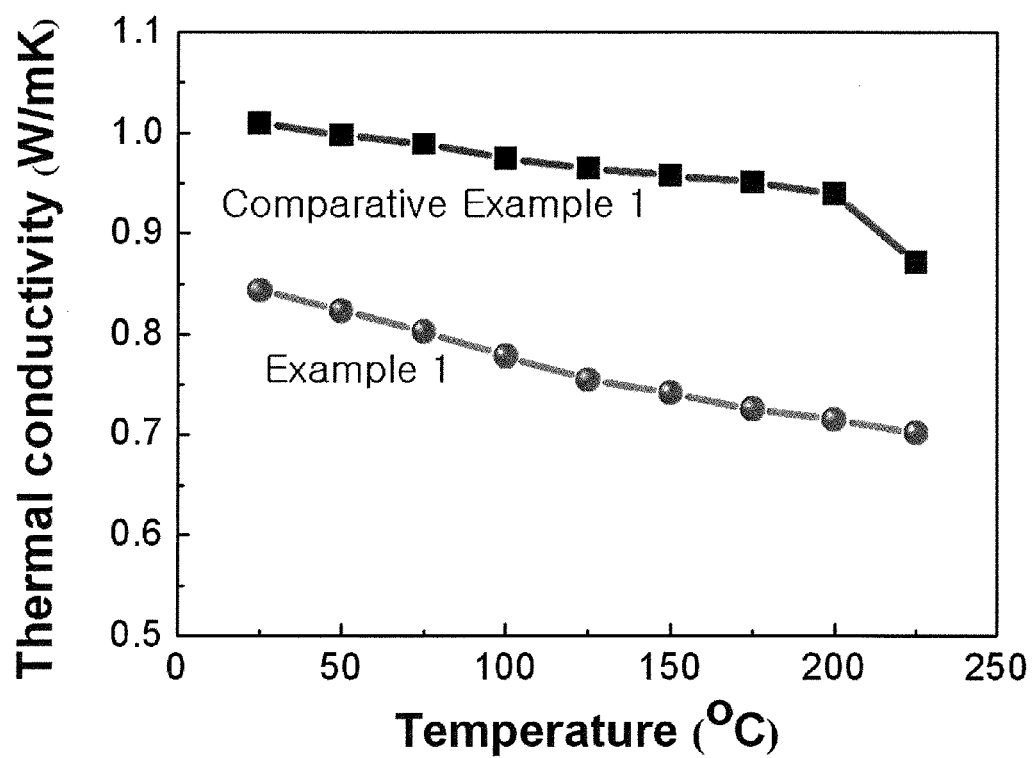
FIG. 11 is a graph of thermal conductivity analysis of the thermoelectric materials fabricated in Example 1 according to an embodiment.

Referring to FIG. 11, it is known that the thermoelectric materials fabricated in Example 1 show lower thermal conductivity than the thermoelectric materials fabricated in Comparative Example 1 regarding the entire range of temperature. That is, since thermoelectric figures of merit ($(ZT = (\sigma\alpha^2/\kappa)T$, $\alpha$: Seebeck coefficient, $\sigma$: electrical conductivity, $\kappa$: thermal conductivity, T: absolute temperature) of thermoelectric materials is high, as long as thermal conductivity is low, it is recognized that thermoelectric materials fabricated in Example 1 show more excellent figures of merit than the thermoelectric materials fabricated in Comparative Example 1 regarding the entire range of temperature to be analyzed. Since nano-particles are homogeneously dispersed inside of thermoelectric materials fabricated Example 1, dispersed nano-particles form a new interface with grain boundary of the thermoelectric materials and scattering of phonon is actively induced. Accordingly, thermal conductivity is lowered efficiently and thermoelectric figure of merit is improved. Also, it is confirmed that thermoelectric materials having excellent thermoelectric figures of merit can be fabricated according to an embodiment of the present invention.

EXPERIMENTAL EXAMPLE 6

Power Factor Analysis

Figure 12:
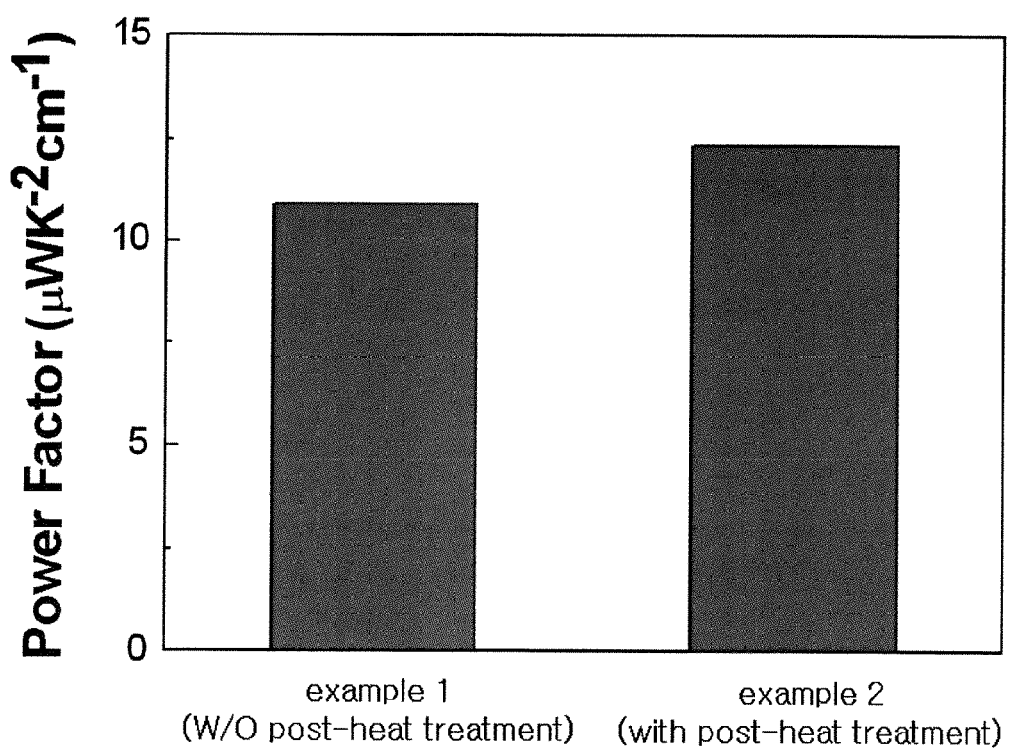
FIG. 12 is a graph analyzing power factor of thermoelectric materials fabricated according to the present invention.

The power factors ($\mu WK^{-2} cm^{-1}$) of thermoelectric materials fabricated in Examples 1 and 2 were calculated by multiplying electric conductivity by Seebeck coefficient and the result thereof is presented in FIG. 12.

Referring to FIG. 12, as comparing the thermoelectric materials of Example 1, which were not performed post-heat treatment to those of Examples 2, which were performed post-heat treatment, it is recognized that the thermoelectric materials of Example 2 have higher power factor. That is, by performing post-heat treatment, $Bi_2Te_3$ phase was clearly shown and impurities were removed, and thus, electric conductivity was improved. Accordingly, it is confirmed that post-heat treatment further improves power factor, to ultimately improve ZT value.

The foregoing exemplary embodiments and advantages are merely exemplary and are not to be construed as limiting the present invention. The present teaching can be readily applied to other types of apparatuses. Also, the description of the exemplary embodiments of the present inventive concept is intended to be illustrative, and not to limit the scope of the claims, and many alternatives, modifications, and variations will be apparent to those of ordinary skill in the art.

What is claimed is:

1. A method of fabricating thermoelectric materials having dispersed nano-particles, comprising:
   step 1) preparing core-shell structured metal oxide nano-particles having a thermoelectric pure bismuth metal element or a thermoelectric pure tellurium metal element coated on a surface of the metal oxide nano-particles;
   step 2) adding and mixing the prepared core-shell structured metal oxide nano-particles of step 1, bismuth (Bi) salts, tellurium (Te) salts and a surfactant in a solvent to form a first mixture;
   step 3) adding and dispersing a reducing agent in the first mixture of step 2 to form a second mixture;
   step 4) heating the second mixture to form a heated second mixture; and
   step 5) post-heat treating the heated second mixture at 250 to 350° C. for 1 hour to 5 hours in a hydrogen atmosphere, after the heating of step 4.

2. The method according to claim 1, wherein the core of the core-shell structured metal oxide nano-particles in step 1) is partially coated with thermoelectric elements.

3. The method according to claim 1, wherein the metal oxide is selected from the group consisting of aluminum oxide, magnesium oxide, titanium oxide, ITO (Indium Tin Oxide), IZO (Indium Zinc Oxide) and $BaTiO_3$.

4. The method according to claim 1, wherein the metal oxide nano-particles of step 1 are prepared in the form of a core-shell structure by the steps of:
   step a) adding and dispersing nano-particles along with a surfactant in a solvent;
   step b) adding and dissolving metal salts of thermoelectric elements to a solvent;
   step c) mixing the solvent with the dispersed metal oxide nano-particles of step a), the solvent with the dissolved metal salts of the thermoelectric elements in step b), and a reducing agent to form a mixture; and
   step d) heating the mixture of step c).

5. The method according to claim 4, wherein the solvent of step a) and step b) is dioctylether or ethylene glycol.

6. The method according to claim 4, wherein the metal salts of thermoelectric elements in step b) are selected from the group consisting of bismuth acetate, bismuth chloride and tellurium chloride.

7. The method according to claim 4, wherein the reducing agent of step c) is 1,2-hexadecanediol, sodium borohydride ($NaBH_4$) or hydrazine ($N_2H_4$).

8. The method according to claim 4, wherein the heating of step d) is performed at a temperature range between 200 and 300° C. for 10 to 60 minutes.

9. The method according to claim 1, wherein the bismuth salts of step 2 is bismuth acetate or bismuth chloride.

10. The method according to claim 1, wherein the tellurium salts of step 2 is tellurium chloride.

11. The method according to claim 1, wherein antimony chloride or selenium chloride is additionally added in the mixture of step 2.

12. The method according to claim 1, wherein the surfactant of step 2 is oleylamine or trioctylphosphine.

13. The method according to claim 1, wherein the solvent of step 2 is dioctylether or ethylene glycol.

14. The method according to claim 1, wherein the reducing agent of step 3 is 1,2-hexadecanediol, sodium borohydride ($NaBH_4$) or hydrazine ($N_2H_4$).

15. The method according to claim 1, wherein the heating of step 4 is performed at a temperature range between 200 and 300° C. for 90 to 150 minutes.

16. The method according to claim 1 further comprising shaping the thermoelectric materials.

* * * * *